United States Patent
Jones

(10) Patent No.: US 8,773,910 B2
(45) Date of Patent: *Jul. 8, 2014

(54) PROGRAMMING TO MITIGATE MEMORY CELL PERFORMANCE DIFFERENCES

(71) Applicant: Micron Technology, Inc., Boise, ID (US)

(72) Inventor: Mason Jones, Seaford, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,503

(22) Filed: Feb. 25, 2013

(65) Prior Publication Data
US 2013/0163344 A1    Jun. 27, 2013

Related U.S. Application Data

(63) Continuation of application No. 12/858,682, filed on Aug. 18, 2010, now Pat. No. 8,385,123.

(51) Int. Cl.
*G11C 11/34*    (2006.01)

(52) U.S. Cl.
USPC .................................... 365/185.18

(58) Field of Classification Search
USPC .................................... 365/185.18
See application file for complete search history.

(56) References Cited

U.S. PATENT DOCUMENTS

| | | | |
|---|---|---|---|
| 5,608,669 A | 3/1997 | Mi et al. | |
| 6,130,847 A | 10/2000 | Huang et al. | |
| 6,166,962 A | 12/2000 | Chen et al. | |
| 6,301,151 B1 | 10/2001 | Engh et al. | |
| 6,438,037 B1 | 8/2002 | Fastow et al. | |
| 7,630,246 B2 | 12/2009 | Roohparvar | |
| 8,385,123 B2 * | 2/2013 | Jones | 365/185.18 |
| 2008/0123406 A1 * | 5/2008 | Ho et al. | 365/185.03 |
| 2008/0170434 A1 * | 7/2008 | Cho et al. | 365/185.03 |
| 2008/0310224 A1 | 12/2008 | Roohparvar et al. | |
| 2009/0273981 A1 | 11/2009 | Moschiano et al. | |
| 2010/0039863 A1 | 2/2010 | Sarin et al. | |
| 2010/0142278 A1 * | 6/2010 | Rho et al. | 365/185.12 |
| 2010/0165739 A1 * | 7/2010 | Moschiano et al. | 365/185.19 |
| 2012/0075932 A1 * | 3/2012 | Moschiano et al. | 365/185.19 |
| 2012/0218818 A1 * | 8/2012 | Han et al. | 365/185.03 |
| 2013/0094292 A1 * | 4/2013 | Park et al. | 365/185.03 |

* cited by examiner

*Primary Examiner* — Hoai V Ho
*Assistant Examiner* — Pablo Huerta
(74) *Attorney, Agent, or Firm* — Dicke, Billig & Czaja, PLLC

(57) ABSTRACT

Methods for programming and memory devices are disclosed. In one such method for programming, a first programming voltage applied to control gates of a group of memory cells generates a maximum threshold voltage of the group of memory cell threshold voltages. A voltage difference between the maximum threshold voltage and a maximum target voltage is used as a gate step voltage for a second programming voltage. Fast and slow programming memory cells are determined from the distribution resulting from the second programming voltage. An effective gate voltage applied to the control gates of the fast programming memory cells is less than an effective gate voltage applied to the control gates of the slow programming memory cells during the third programming voltage.

18 Claims, 5 Drawing Sheets

PROGRAMMING TO MITIGATE MEMORY CELL PERFORMANCE DIFFERENCES

RELATED APPLICATION

This application is a continuation of U.S. application Ser. No. 12/858,682, titled "PROGRAMMING TO MITIGATE MEMORY CELL PERFORMANCE DIFFERENCES," filed Aug. 18, 2010 and issued as U.S. Pat. No. 8,385,123 on Feb. 26, 2013, which is commonly assigned and incorporated in its entirety herein by reference.

TECHNICAL FIELD

The present embodiments relate generally to memory and a particular embodiment relates to non-volatile memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

Non-volatile memory cells can be programmed as single level cells (SLC) or multiple level cells (MLC). Single level cells have two states, erased and programmed, that can typically be illustrated by the SLC distributions of FIG. 1A. Multiple level cells can typically be illustrated by the MLC distributions of FIG. 1B.

FIG. 1A shows that an erased state 100 of SLC memory, typically a logical 1 state, is shown as a negative state. The programmed state 101, typically a logical 0 state, is shown as a positive state.

FIG. 1B shows that the erased state 103 of MLC memory, typically a logical 11 state, is shown as the negative state. The programmed states 104-106 are illustrated as positive states that can be labeled as a logical 10 state 104, a logical 00 state 105, and a logical 01 state 106.

As is evident from FIGS. 1A and 1B, the non-volatile memory cells can be programmed from the erased state to one of the programmed states by increasing a threshold voltage ($V_t$) of a target memory cell from a negative threshold voltage to a target threshold voltage of one of the desired programmed states. The threshold voltage is typically increased by a series of incrementally increasing programming pulses, each programming pulse followed by a verify pulse to determine the present threshold voltage of the memory cell. The programming pulses start at an initial programming voltage and increase by a step voltage until the memory cell verifies as being programmed to the target threshold voltage.

Due to manufacturing and material variations in the integrated circuit die, memory cells of a memory array program at different rates. Thus, there will be slow programming memory cells and fast programming memory cells in any memory array. A programming method could end up over-programming the faster programming memory cells.

Depending on the threshold voltage to which a memory cell is being programmed, a total of five to eight programming/verify pulses might be used to properly program an SLC memory cell. Even though an entire page of memory cells is typically programmed at one time, the time required to program the large number of pages in a memory device can reduce the performance of a memory system during a programming operation.

For the reasons stated above, and for other reasons that will become apparent to those skilled in the art upon reading and understanding the present specification, there is a need in the art for a way to improve programming performance of memory.

DETAILED DESCRIPTION

Figure 1B:
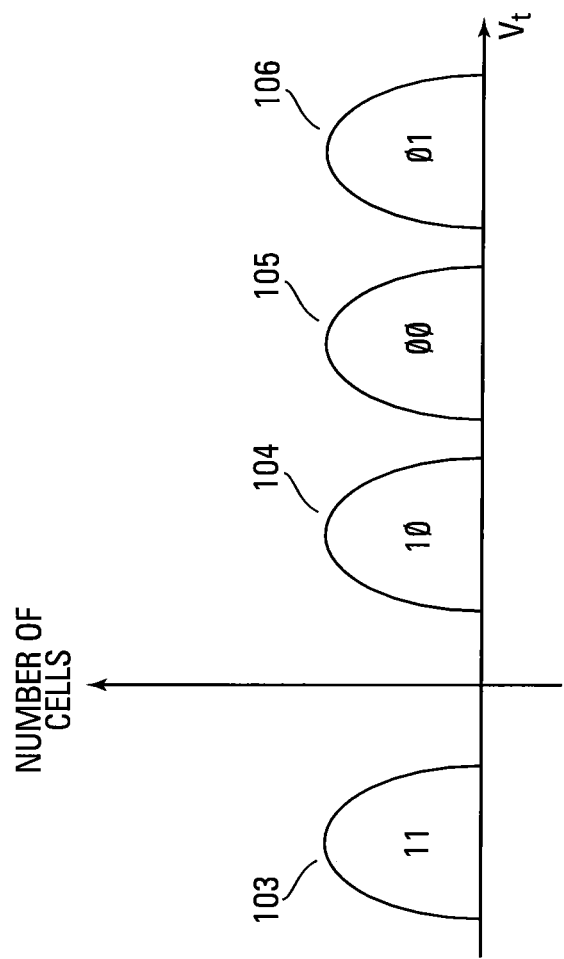
FIGS. 1A and 1B show typical prior art threshold voltage distributions for SLC and MLC memory.
Figure 1A:
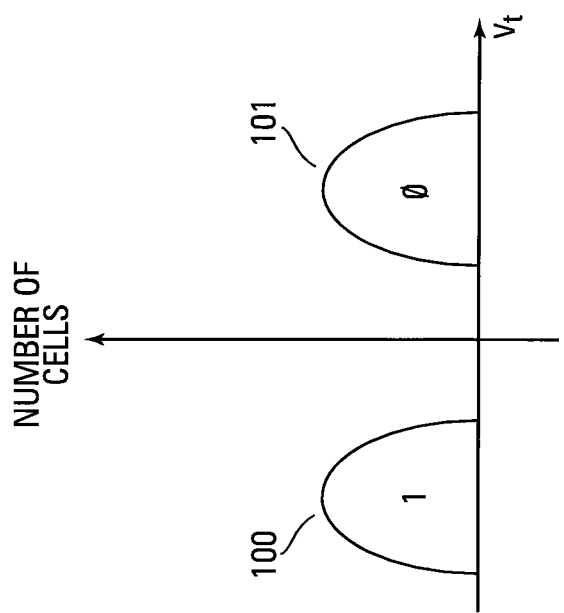

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
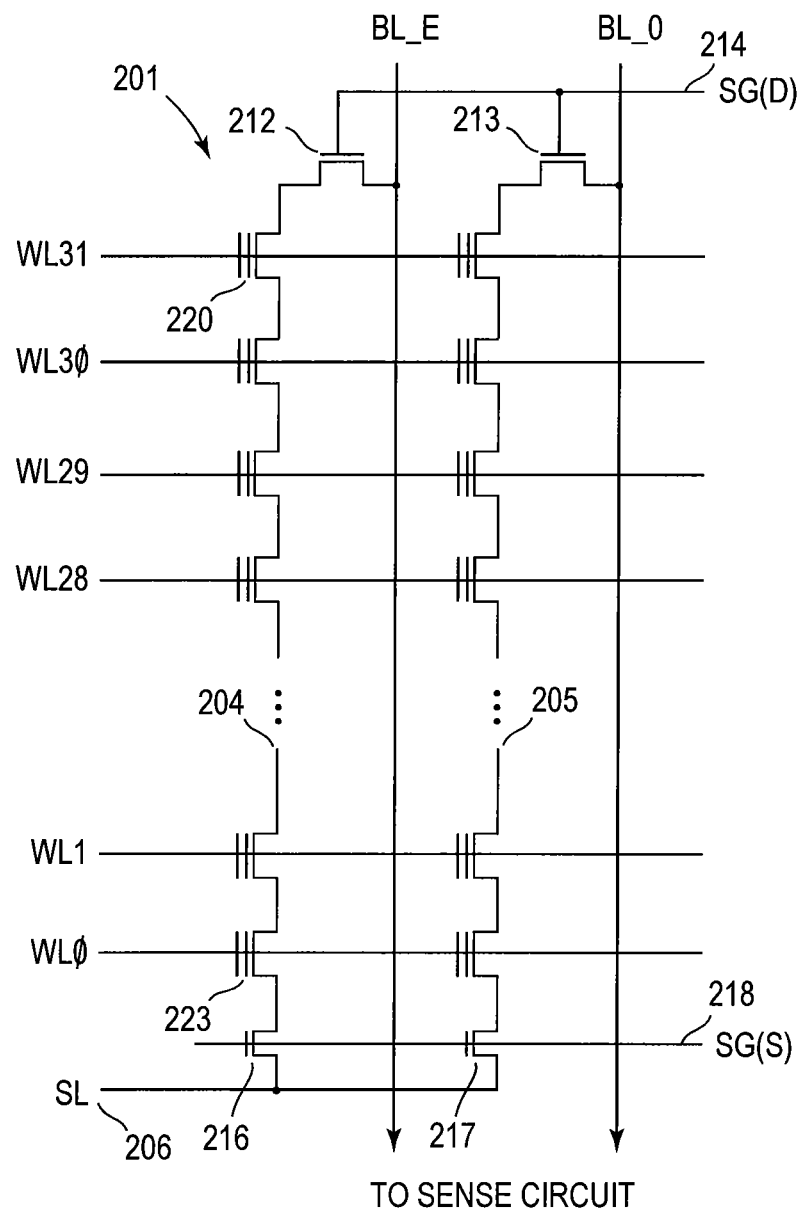
FIG. 2 shows a schematic diagram of one embodiment of a portion of a NAND architecture non-volatile memory array.

FIG. 2 illustrates a schematic diagram of one embodiment of a portion of a NAND architecture non-volatile memory array 201 comprising series strings of non-volatile memory cells that can be programmed using the embodiments of the subsequently described method for programming. The present embodiments are not limited to the illustrated NAND architecture. Alternate embodiments can use NOR or other architectures as well.

The memory array 201 comprises an array of non-volatile memory cells 201 (e.g., floating gate) arranged in columns such as series strings 204, 205. Each of the cells are coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the drains of the top memory cells of the series strings and eventually coupled to sense circuitry that detect the state of each cell by sensing a current or voltage on a selected bit line.

Each series string 204, 205 of memory cells is coupled to a source line 206 by a source select gate transistor 216, 217 and to an individual bit line BL_E, BL_O by a drain select gate transistor 212, 213. The source select gate transistors 216, 217 are controlled by a source select gate control line SG(S) 218 coupled to their control gates. The drain select gate transistors 212, 213 are controlled by a drain select gate control line SG(D) 214.

Each memory cell can be programmed as a single level cell (SLC) or a multiple level cell (MLC). Each cell's threshold voltage ($V_t$) is indicative of the data that is stored in the cell.

For example, in an SLC, a $V_t$ of 1.5V might indicate a programmed cell while a $V_t$ of −0.5V might indicate an erased cell. The MLC uses multiple $V_t$ ranges that each indicates a different state. Multiple level cells can take advantage of the analog nature of a flash cell by assigning a bit pattern to a specific $V_t$ range. This technology enables the storage of data values representing two or more bits per cell, depending on the quantity of $V_t$ ranges assigned to the cell.

One programming method that mitigates programming differences between slower and faster programming memory cells utilizes a two stage approach. An initial programming stage moves the threshold voltage quickly through the voltage difference between the erased state and the target threshold voltage. A second programming stage moves the threshold voltage quickly through the distribution resulting from the first stage. An optional stage can be used to finish the programming by increasing the threshold voltages of those memory cells that have not yet reached their target threshold voltages.

Figure 3:
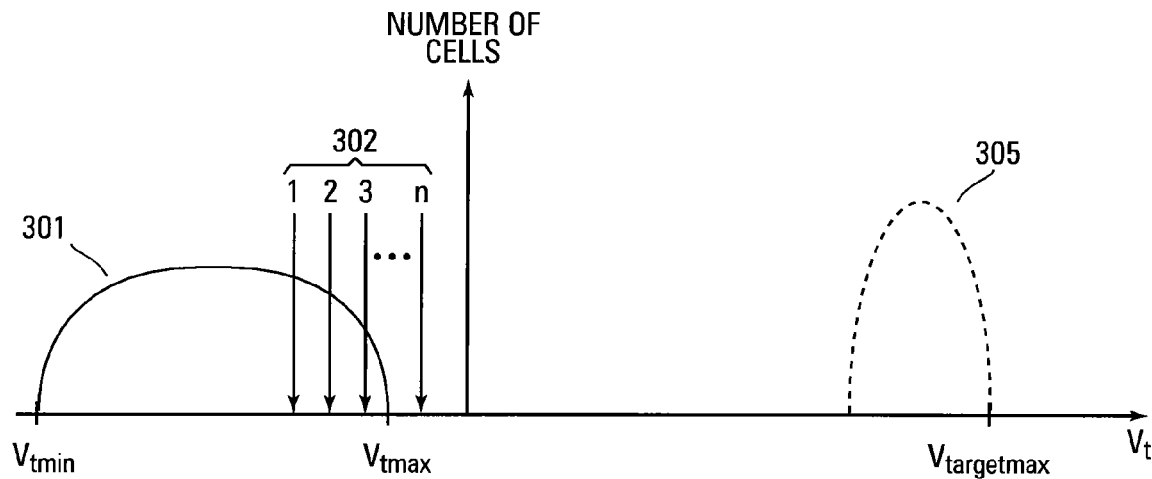
FIG. 3 shows a dynamic gate voltage stage of one embodiment of a method for programming

FIG. 3 illustrates a dynamic gate voltage stage of one embodiment of a programming method. This stage determines the dynamic gate voltage that is to be applied to the target memory cell control gates by the subsequent programming pulse.

The distribution illustrated is the result of an initial programming pulse, at a word line start voltage, being applied to a selected word line, or other grouping of memory cells, that is coupled to the control gates of the row of memory cells to be programmed. In one embodiment, the word line comprises a page or other grouping of memory cells to be programmed.

The word line start voltage can be determined, in one embodiment, in response to a difference between the erased voltage and the target voltage. For example, in an MLC device, if a memory cell is being programmed from the erased state to the highest programmed state, a larger word line start voltage is used. If the memory cell in the MLC device is only being programmed to the lowest programmed state, a lower word line start voltage can be used.

The bit lines that are coupled to the memory cells being programmed are initially biased at a low voltage (e.g., 0V). In one embodiment, only alternate bit lines are programmed at one time. For example, memory cells coupled to the even bit lines might be programmed initially and memory cells coupled to the odd bit lines could then be programmed.

The lower the bit line voltage, the faster the programming of the memory cells coupled to that particular bit line. Conversely, the higher the bit line voltage, the slower the programming of the memory cells coupled to that particular bit line. This is a result of at least the effective gate voltage that results from a difference between the programming pulse voltage applied to the memory cell control gate and the channel voltage caused by the bit line biasing. Thus, memory cells coupled to a bit line biased at an inhibit voltage (e.g., a supply voltage) would not program even when their respective control gates were biased with a programming voltage.

The initial pulse results in a Gaussian distribution of threshold voltages of memory cells 301 having a maximum threshold voltage ($V_{tmax}$) and a minimum threshold voltage ($V_{tmin}$). The Gaussian distribution is a result of the memory cells having their threshold voltages increased at different rates by the initial programming pulse. For example, the lower end of the distribution 301 includes the slower programming memory cells while the upper end of the distribution 301 includes the faster programming memory cells.

In order to detect the amplitude of the maximum $V_t$, a series of read operations 302 are performed. Each read operation 1-n comprises a read pulse at a different voltage. If the read pulse turns on the target memory cell, as detected by the sense circuitry, the threshold voltage for that particular memory cell is less than or equal to that particular read voltage. The four different read operations 1-n at the four different voltages, as shown in FIG. 3, are for purposes of illustration only since the actual quantity of read operations depends on the quantity of read operations necessary to determine the maximum $V_t$.

Once the maximum $V_t$ of the initial distribution 301 is determined, it is possible to determine the largest approximate dynamic gate step voltage that can be used for increasing the threshold voltage of the target memory cell without affecting the width of the final target distribution 305. The final target distribution 305 is the distribution of threshold voltages of the target state for the group of memory cells being programmed.

In one embodiment, the voltage difference between the maximum target threshold voltage ($V_{targetmax}$) and $V_{tmax}$ is used as the dynamic gate step voltage for the subsequent programming pulse. This voltage should not result in over-programming since it is less than $V_{targetmax}$. The dynamic gate step voltage is added to the initial word line start voltage to obtain the voltage for the subsequent programming pulse.

Figure 4:
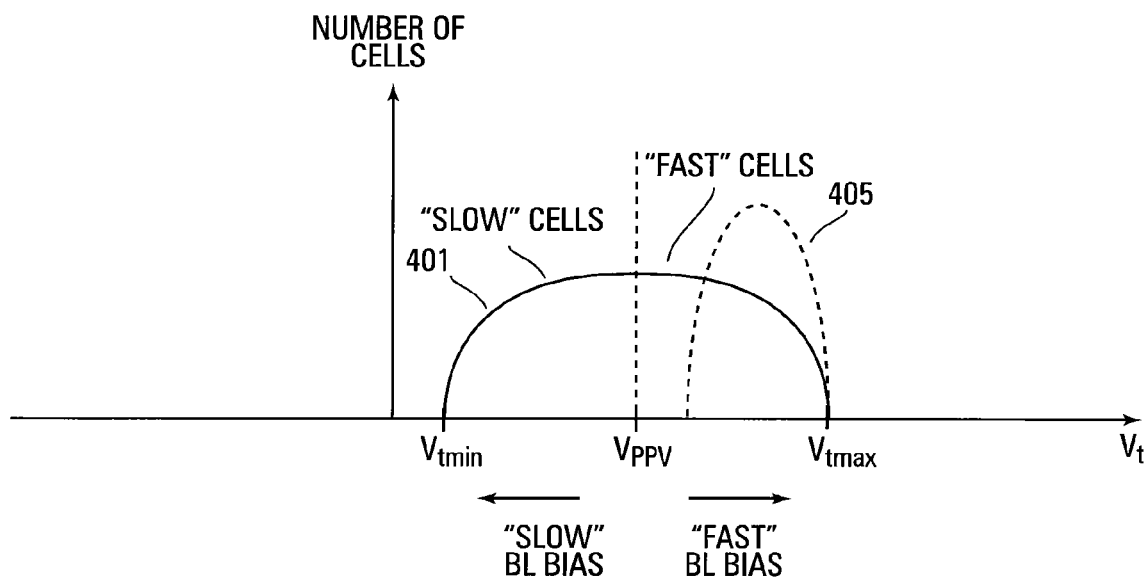
FIG. 4 shows a bit line biasing stage of one embodiment of the method for programming

FIG. 4 illustrates a bit line biasing stage of one embodiment of a method for programming. This stage determines the bit line biasing to be used for the subsequent programming pulse.

The distribution illustrated in FIG. 4 is the result of a second programming pulse being applied to the selected word line that is coupled to the control gates of memory cells to be programmed. The voltage of the second programming pulse is determined by the sum of the dynamic gate step voltage and the voltage of the initial programming pulse (e.g., word line start voltage). The resulting Gaussian distribution of threshold voltages of the memory cells 401 still has a maximum threshold voltage ($V_{tmax}$) and a minimum threshold voltage ($V_{tmin}$) but is shifted upward by approximately the dynamic gate step voltage that was used in the second programming pulse.

In the stage illustrated in FIG. 4, the distribution 401 is split into "slow" and "fast" programming cells by performing a verify operation with a pre-program verify (PPV) pulse at $V_{PPV}$. This pulse determines which memory cells within the distribution are above $V_{PPV}$ and which are below $V_{PPV}$. $V_{PPV}$, in one embodiment, is the mid-point voltage of the distribution. Alternate embodiments might use other voltages.

The memory cells above $V_{PPV}$ are the "fast" programming memory cells and the bit line to which these memory cells are coupled is biased at the "fast" bit line bias voltage. The memory cells below $V_{PPV}$ are the "slow" programming memory cells and the bit line to which these memory cells are coupled is biased at the "slow" bit line bias voltage. The "fast" bit line bias voltage is greater than the "slow" bit line bias voltage in order to slow down the programming of the faster memory cells. In one embodiment, the "fast" bit line bias voltage is 1.5V and the "slow" bit line bias voltage is 0V. Alternate embodiments might use other voltages within a range of 0V to $V_{CC}$ to achieve substantially the same result of slowing down the fast programming memory cells. Once the bit line bias voltages are determined, those bit lines are locked at their respective voltages so that no further pre-programming verify operations are performed.

The different bit line bias voltages reduce the effective gate step voltage that is added to the previous programming voltage and applied to the word line of memory cells that are being programmed. As discussed previously, biasing the bit lines at the higher voltage causes the memory cell channel to be coupled up to that voltage so that the difference between the gate voltage and the channel voltage is reduced. Thus, the effective gate voltage is reduced for the "fast" programming memory cells as compared to the "slow" programming memory cells. For example, the previous two programming pulses might have resulted in a 3.8V effective step voltage for all of the memory cells being programmed. When bit lines coupled to memory cells that are programming faster than others are biased at 1.5V, the effective gate step voltage for the faster programming memory cells might be 1.8V while the effective gate step voltage for the slower programming memory cells might still be 3.8V. The bit line biasing stage tightens the final target distribution by simultaneously moving the faster programming memory cells by a smaller step and the slower programming memory cells by a larger step so that the resulting threshold voltage distribution is reduced.

Figure 5:
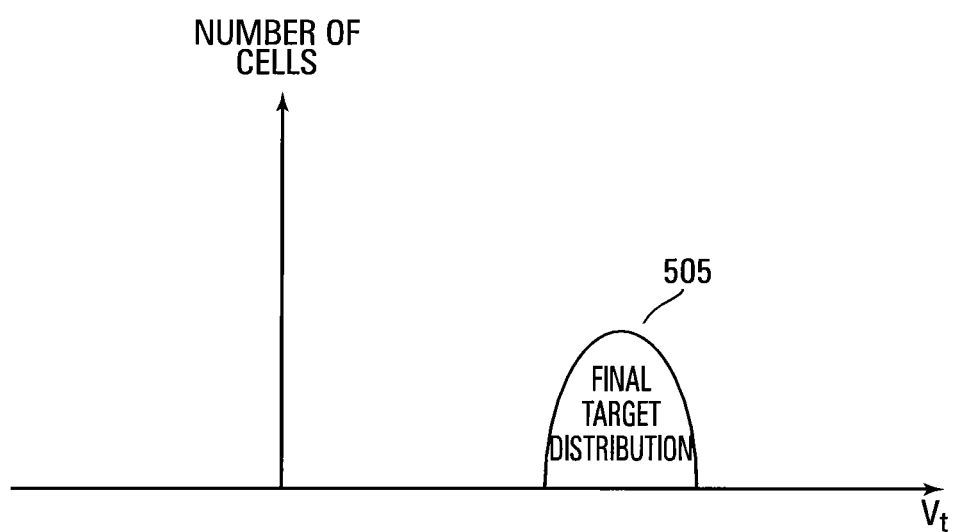
FIG. 5 shows an optional clean-up stage of one embodiment of the method for programming.

FIG. 5 illustrates a clean-up stage of one embodiment of a method for programming. This stage can be used if any memory cells to be programmed remain below the final target distribution 505.

The distribution illustrated in FIG. 5 is the result of the third programming pulse being applied to the selected word line that is coupled to the control gates of memory cells to be programmed while the bit lines are biased as discussed previously. The programming voltage of the third programming pulse uses a unique gate step size that is different from the dynamic gate step voltage of the second programming pulse. However, as previously described, the effective gate voltage for each memory cell might be different.

The resulting Gaussian distribution of memory cells 505 might include all the memory cells being programmed. If any of the memory cells are still not programmed to the target state, additional programming pulses can be applied to the word line that is coupled to the control gates of the memory cells still to be programmed. The bit lines coupled to the memory cells that are already programmed are biased at an inhibit voltage that prevents them from being programmed further while the remaining memory cells are still experiencing the programming pulses. In one embodiment, the inhibit voltage can be a supply voltage.

The final target distribution 505 of FIG. 5 can represent the target state to which the memory cells are being programmed. In an SLC embodiment, this can be a logical 0 state. In an MLC embodiment, this can be any one of the non-erased states (e.g., 10, 00, 01).

Figure 6:
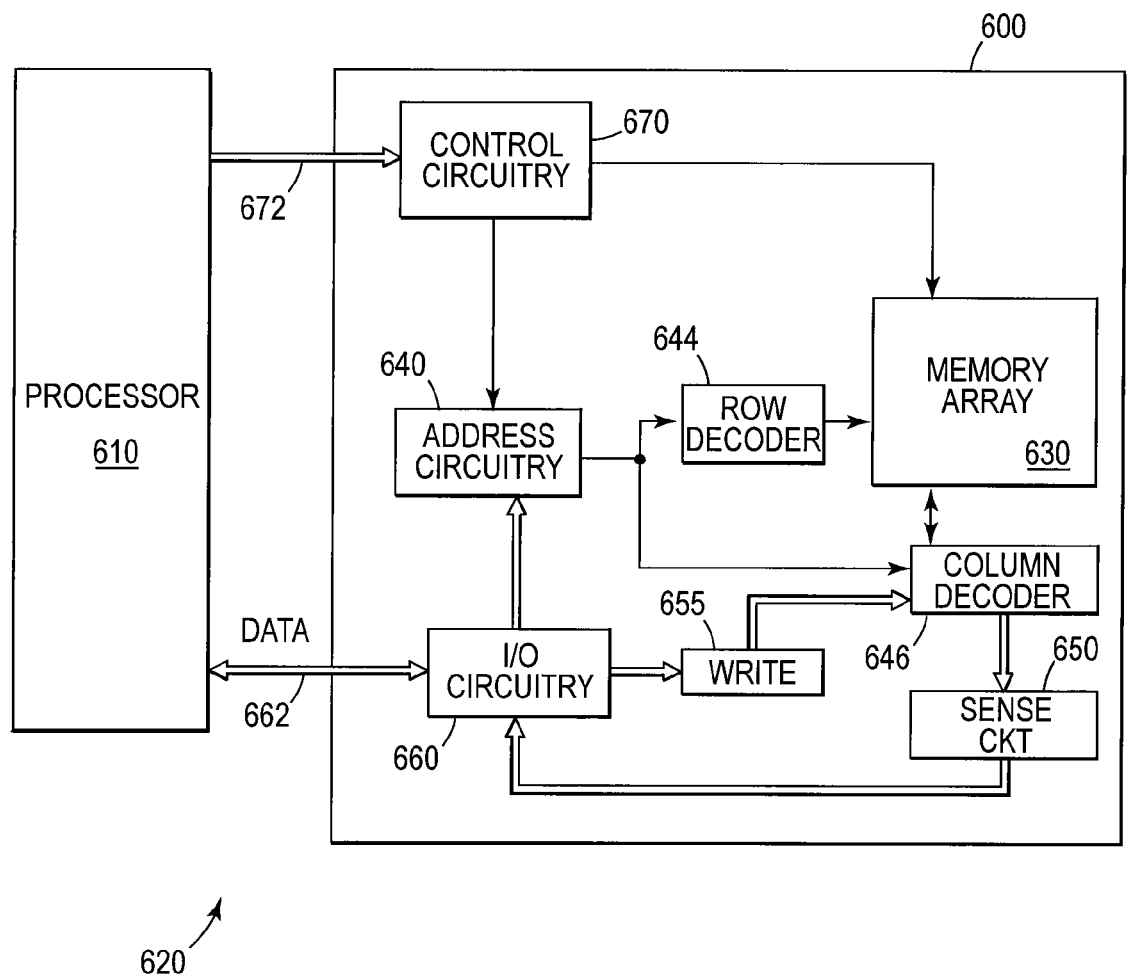
FIG. 6 shows a block diagram of one embodiment of a memory system that can incorporate the method for programming in accordance with FIGS. 3-5.

FIG. 6 illustrates a functional block diagram of a memory device 600. The memory device 600 is coupled to an external processor 610. The processor 610 may be a microprocessor or some other type of controller. The memory device 600 and the processor 610 form part of a memory system 620. The memory device 600 has been simplified to focus on features of the memory that are helpful in understanding the present embodiments.

The memory device 600 includes an array 630 of memory cells (e.g., floating gate memory cells) such as the array of FIG. 3. The memory array 630 is arranged in banks of word line rows and bit line columns. In one embodiment, the columns of the memory array 630 comprise series strings of memory cells.

Address buffer circuitry 640 is provided to latch address signals provided through I/O circuitry 660. Address signals are received and decoded by a row decoder 644 and a column decoder 646 to access the memory array 630. It will be appreciated by those skilled in the art with the benefit of the present description that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense amplifier circuitry 650. The sense amplifier circuitry 650, in one embodiment, is coupled to read and latch a row of data from the memory array 630. Data input and output buffer circuitry 660 is included for bidirectional data communication as well as the address communication over a plurality of data connections 662 with the controller 610. Write circuitry 655 is provided to write data to the memory array.

Memory control circuitry 670 decodes signals provided on control connections 672 from the processor 610. These signals are used to control the operations on the memory array 630, including data read, data write (program), and erase operations. The memory control circuitry 670 may be a state machine, a sequencer, or some other type of controller to generate the memory control signals. In one embodiment, the memory control circuitry 670 is configured to control the timing and generation of voltages for the embodiments of the above-described programming method.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments provide programming of non-volatile memory cells while mitigating the performance differences between fast and slow programming cells. The programming method can also reduce the time for programming by reducing the quantity of programming pulses used to reach the target state.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for programming a memory device, comprising:
   applying a first programming voltage to a group of memory cells;
   applying a second programming voltage to the group of memory cells;
   wherein the second programming voltage exceeds the first programming voltage by a step voltage that is a difference between a maximum target voltage and a maximum threshold voltage for the group of memory cells; and
   wherein the maximum threshold voltage for the group of memory cells is responsive to the application of the first programming voltage.

2. The method of claim 1, further comprising applying additional programming voltages to memory cells of the group of memory cells that are not programmed after application of the second programming voltage.

3. The method of claim 1, further comprising, after applying the second programming voltage, determining a programming rate of the memory cells of the group of memory cells responsive to a program verify voltage.

4. A method for programming a memory device, comprising:

applying a first programming voltage to a group of memory cells;

applying a second programming voltage to the group of memory cells;

after applying the second programming voltage, determining a programming rate of the memory cells of the group of memory cells responsive to a program verify voltage;

applying a first effective gate voltage to memory cells having threshold voltages greater than the program verify voltage and a second effective gate voltage to memory cells having threshold voltages less than the program verify voltage, wherein the second effective gate voltage is greater than the first effective gate voltage;

wherein the second programming voltage is responsive to a maximum threshold voltage for the group of memory cells; and wherein the maximum threshold voltage for the group of memory cells is responsive to the application of the first programming voltage.

5. The method of claim 4, wherein the first effective gate voltage is substantially a difference between a channel voltage and a control gate voltage of the memory cells having threshold voltages greater than the program verify voltage and the second effective gate voltage is substantially a difference between a channel voltage and a control gate voltage of the memory cells having threshold voltages less than the program verify voltage.

6. The method of claim 4, wherein the memory cells having threshold voltages greater than the program verify voltage are first memory cells and the memory cells having threshold voltages less than the program verify voltage are second memory cells, wherein applying the first effective gate voltage to the first memory cells comprises applying a third programming voltage to control gates of the first memory cells and a first bias voltage to first data lines coupled to the first memory cells, wherein applying the second effective gate voltage to the second memory cells comprises applying the third programming voltage to control gates of the second memory cells and a second bias voltage to data lines coupled to the second memory cells, wherein the second bias voltage is less than the first bias voltage.

7. A method for programming a memory device, comprising:

determining a maximum threshold voltage for a group of memory cells resulting from applying a first programming voltage to the group of memory cells;

determining a step voltage that is a difference between a maximum target voltage and the maximum threshold voltage for the group of memory cells; and applying a second programming voltage to the group of memory cells, wherein the second programming voltage is equal to a sum of the first programming voltage and the step voltage.

8. The method of claim 7, wherein determining the maximum threshold voltage comprises performing a plurality of read operations on the group of memory cells after applying the first programming voltage.

9. The method of claim 8, wherein the maximum threshold voltage is less than or equal to a maximum read voltage applied during the plurality of read operations.

10. The method of claim 7, wherein determining the maximum threshold voltage for a group of memory cells comprises determining a maximum threshold voltage of a distribution of threshold voltages of the group of memory cells that results from applying the first programming voltage to the group of memory cells.

11. A method for programming a memory device, comprising:

determining a maximum threshold voltage for a group of memory cells resulting from applying a first programming voltage to the group of memory cells;

determining a step voltage that is a difference between a maximum target voltage and the maximum threshold voltage for the group of memory cells; and applying a second programming voltage to the group of memory cells, wherein the second programming voltage is equal to a sum of the first programming voltage and the step voltage;

wherein the first and second programming voltages are applied to control gates of the group of memory cells, and further comprising, after applying the second programming voltage:

applying a first biasing voltage to data lines coupled to memory cells of the group of memory cells having threshold voltages, resulting from applying the second programming voltage to the group of memory cells, that are greater than a certain voltage;

applying a second biasing voltage to data lines coupled to memory cells of the group of memory cells having threshold voltages, resulting from applying the second programming voltage to the group of memory cells, that are less than the certain voltage, wherein the second biasing voltage is less than the first biasing voltage; and applying a third programming voltage to the control gates of the group of memory cells.

12. The method of claim 11, wherein the certain voltage is midway between a minimum threshold voltage for the group of memory cells, resulting from applying the second programming voltage to the group of memory cells, and a maximum threshold voltage for the group of memory cells, resulting from applying the second programming voltage to the group of memory cells.

13. The method of claim 12, wherein the maximum threshold voltage for the group of memory cells resulting from applying the second programming voltage to the group of memory cells exceeds the maximum threshold voltage for the group of memory cells resulting from applying a first programming voltage to the group of memory cells by approximately the step voltage.

14. The method of claim 11, wherein the certain voltage is applied to the control gates of the memory cells of the group of memory cells during a program verify operation after applying the second programming voltage.

15. A memory device, comprising:

an array of memory cells; and control circuitry coupled to the memory array;

wherein the control circuitry is configured to apply a first programming voltage to a group of memory cells;

wherein the control circuitry is configured to apply a second programming voltage to the group of memory cells;

wherein the second programming voltage exceeds the first programming voltage by a step voltage that is a difference between a maximum target voltage and a maximum threshold voltage for the group of memory cells; and wherein the maximum threshold voltage for the group of memory cells is responsive to the application of the first programming voltage.

16. The memory device of claim 15, wherein the control circuitry is further configured to generate a series of read operations, each read operation having a greater read voltage than a previous read voltage in the series of read operations, wherein the maximum threshold voltage is less than or equal to a maximum of the read voltages.

17. A memory device, comprising:
an array of memory cells; and
control circuitry coupled to the memory array;
wherein the control circuitry is configured to apply a first programming voltage to a group of memory cells;
wherein the control circuitry is configured to apply a second programming voltage to the group of memory cells;
wherein the second programming voltage is responsive to a maximum threshold voltage for the group of memory cells; and
wherein the maximum threshold voltage for the group of memory cells is responsive to the application of the first programming voltage;
wherein the control circuitry is configured to apply a first effective gate voltage to memory cells of the group of memory cells having threshold voltages, responsive to the second programming voltage, that are greater than a certain voltage and to apply a second effective gate voltage to memory cells of the group of memory cells having threshold voltages, responsive to the second programming voltage, that are less than the certain voltage, wherein the second effective gate voltage is greater than the first effective gate voltage.

18. A memory device, comprising:
an array of memory cells; and
control circuitry coupled to the memory array;
wherein the control circuitry is configured to apply a first programming voltage to a group of memory cells;
wherein the control circuitry is configured to apply a second programming voltage to the group of memory cells;
wherein the second programming voltage is responsive to a maximum threshold voltage for the group of memory cells; and
wherein the maximum threshold voltage for the group of memory cells is responsive to the application of the first programming voltage;
wherein the memory control circuitry is configured to apply a third programming voltage to control gates of memory cells of the group of memory cells having threshold voltages, responsive to the second programming voltage, that are greater than a certain voltage and a first bias voltage to data lines coupled the memory cells of the group of memory cells having threshold voltages, responsive to the second programming voltage, that are greater than the certain voltage, wherein the memory control circuitry is configured to apply the third programming voltage to control gates of memory cells of the group of memory cells having threshold voltages, responsive to the second programming voltage, that are less than the certain voltage and a second bias voltage to data lines coupled the memory cells of the group of memory cells having threshold voltages, responsive to the second programming voltage, that are less than the certain voltage; wherein the second bias voltage is less than the first bias voltage.

* * * * *

UNITED STATES PATENT AND TRADEMARK OFFICE
CERTIFICATE OF CORRECTION

PATENT NO.        : 8,773,910 B2
APPLICATION NO.   : 13/775503
DATED             : July 8, 2014
INVENTOR(S)       : Mason Jones Page 1 of 1

It is certified that error appears in the above-identified patent and that said Letters Patent is hereby corrected as shown below:

In the Claims:

In column 10, line 15, in Claim 18, after "coupled" insert -- to --.
In column 10, line 24, in Claim 18, after "coupled" insert -- to --.

Signed and Sealed this
Thirtieth Day of September, 2014

Michelle K. Lee
*Deputy Director of the United States Patent and Trademark Office*